(12) United States Patent
Kidambi et al.

(10) Patent No.: US 11,349,490 B2
(45) Date of Patent: May 31, 2022

(54) DUAL-PATH DIGITAL FILTERING IN AN ANALOG-TO-DIGITAL CONVERSION SYSTEM

(71) Applicant: Cirrus Logic International Semiconductor Ltd., Edinburgh (GB)

(72) Inventors: Sunder S. Kidambi, Austin, TX (US); Mohit Sood, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/167,957

(22) Filed: Feb. 4, 2021

(65) Prior Publication Data

US 2021/0281270 A1 Sep. 9, 2021

Related U.S. Application Data

(60) Provisional application No. 62/984,403, filed on Mar. 3, 2020.

(51) Int. Cl.
*H03M 1/06* (2006.01)
*H02M 1/00* (2006.01)
*H03H 17/06* (2006.01)

(52) U.S. Cl.
CPC .......... *H03M 1/0626* (2013.01); *H02M 1/00* (2013.01); *H03H 17/0671* (2013.01); *H02M 1/0012* (2021.05)

(58) Field of Classification Search
CPC ............. H03M 1/1215; H03M 1/0626; H03M 1/1033; H03M 1/0612; H03M 3/43; H03M 1/121; H03M 1/06; H03M 1/0607; H03M 1/0682; H03M 1/0836; H03M 1/1009; H03M 1/1019; H03M 1/122; H03M 1/167; H03M 1/40; H03M 1/46; H03M 1/66; H03M 3/382; H03M 3/456; H03M 1/0609; H03M 1/0621; H03M 1/1071; H03M 1/12; H03M 1/1205; H03M 1/745; H03M 3/364; H03M 3/42; H03M 3/438; H03M 3/448; H03M 3/452
(Continued)

(56) References Cited

U.S. PATENT DOCUMENTS 7,193,544 B1 * 3/2007 Fitelson ................ H03M 3/396
341/143
7,466,250 B2 * 12/2008 Buisson .............. H03M 1/1019
341/120

(Continued)

*Primary Examiner* — Linh V Nguyen
(74) *Attorney, Agent, or Firm* — Jackson Walker L.L.P.

(57) ABSTRACT

An analog-to-digital conversion system may include an analog-to-digital converter configured to convert an analog input signal into an equivalent digital input signal, a first filtering path configured to filter the equivalent digital input signal to generate a first filtered digital signal, wherein the first filtering path comprises a zero-overshoot monotonic step response filter, a second filtering path configured to filter the equivalent digital input signal to generate a second filtered digital signal, wherein the second filtering path comprises a frequency-selective filter; and a mixer configured to either: (i) select between the first filtered digital signal and the second filtered digital signal in order to generate an output digital signal; or (ii) combine selected proportions of each of the first filtered digital signal and the second filtered digital signal in order to generate the output digital signal.

18 Claims, 4 Drawing Sheets

(58) Field of Classification Search
USPC .................................. 341/118–121, 141, 142
See application file for complete search history.

(56) References Cited

U.S. PATENT DOCUMENTS

| | | | |
|---|---|---|---|
| 9,407,276 B1* | 8/2016 | Coban | H03M 1/124 |
| 9,634,680 B1* | 4/2017 | Ray | H03M 1/1033 |
| 9,837,990 B1* | 12/2017 | Pagnanelli | H03M 3/468 |
| 2010/0295716 A1* | 11/2010 | Yamaki | H03M 1/0863 |
| | | | 341/155 |
| 2017/0117914 A1* | 4/2017 | Choi | H03M 1/1004 |
| 2017/0324421 A1* | 11/2017 | Tangudu | H03M 1/1245 |
| 2019/0238152 A1* | 8/2019 | Pagnanelli | H03M 3/436 |
| 2019/0296757 A1* | 9/2019 | Kuwahara | H03M 1/124 |
| 2019/0312584 A1* | 10/2019 | Raman | H03M 3/368 |
| 2020/0162089 A1* | 5/2020 | Shih | H03M 1/0626 |

* cited by examiner

DUAL-PATH DIGITAL FILTERING IN AN ANALOG-TO-DIGITAL CONVERSION SYSTEM

CROSS-REFERENCE AND RELATED APPLICATION

The present disclosure claims benefit of U.S. Provisional Patent Application Ser. No. 62/984,403, filed Mar. 3, 2020, which is incorporated by reference herein in its entirety.

FIELD OF DISCLOSURE

The present disclosure relates in general to circuits for electronic devices, including without limitation personal portable devices such as wireless telephones and media players, and more specifically, to dual-path filtering in an analog-to-digital conversion system, for example an analog-to-digital conversion system that may be used in battery management and/or in a power delivery network.

BACKGROUND

Portable electronic devices, including wireless telephones, such as mobile/cellular telephones, tablets, cordless telephones, mp3 players, and other consumer devices, are in widespread use. Such a portable electronic device may include circuitry for implementing a power converter for converting a battery voltage (e.g., provided by a lithium-ion battery) into a supply voltage delivered to one or more components of the portable electronic device. The power delivery network may also regulate such supply voltage, and isolate the downstream loads of these one or more devices from fluctuation in an output voltage of the battery over the course of operation.

In addition to regulating the supply rail for the supply voltage, it may be desirable for the power converter (or a control circuit for the power converter) to provide for active protection mechanisms to limit an amount of current that can be drawn by the one or more components powered from the supply rail. For example, such active protection mechanisms may provide protection for a battery that supplies energy to the power delivery network.

Such battery protection schemes may include control circuitry that may sense physical quantities associated with the power delivery network (e.g., voltages, currents, etc.) to ensure operation of the power delivery network within allowable ranges. Such sensing circuitry may use analog-to-digital conversion systems in order to convert an analog measurement of a physical quantity into an equivalent digital representation. In addition to an analog-to-digital converter, analog-to-digital conversion systems may include additional circuitry, such as filters, to further condition the measured physical quantity.

However, a disadvantage of current filtering approaches is that digital filters having an impulse response that goes negative exhibit a non-monotonic response and an overshoot in response to a step input. Commonly-designed recursive or non-recursive filters that have low passband ripple with sharp transition band and linear phase characteristics are prone to overshoot since their impulse response goes negative, which may be disadvantageous in many applications. Conversely, filters without overshoot have non-linear phase, non-monotonic step response and/or relatively high passband droop with a gradual transition band, which may also be disadvantageous in many applications.

SUMMARY

In accordance with the teachings of the present disclosure, certain disadvantages and problems associated with performance of existing digital filters may be reduced or eliminated.

In accordance with embodiments of the present disclosure, an analog-to-digital conversion system may include an analog-to-digital converter configured to convert an analog input signal into an equivalent digital input signal, a first filtering path configured to filter the equivalent digital input signal to generate a first filtered digital signal, wherein the first filtering path comprises a zero-overshoot monotonic step response filter, a second filtering path configured to filter the equivalent digital input signal to generate a second filtered digital signal, wherein the second filtering path comprises a frequency-selective filter; and a mixer configured to either: (i) select between the first filtered digital signal and the second filtered digital signal in order to generate an output digital signal; or (ii) combine selected proportions of each of the first filtered digital signal and the second filtered digital signal in order to generate the output digital signal.

In accordance with these and other embodiments of the present disclosure, a method may include converting an analog input signal into an equivalent digital input signal, filtering, with a first filtering path, the equivalent digital input signal to generate a first filtered digital signal, wherein the first filtering path comprises a zero-overshoot monotonic step response filter, filtering, with a second filtering path, the equivalent digital input signal to generate a second filtered digital signal, wherein the second filtering path comprises a frequency-selective filter, and either: (i) selecting between the first filtered digital signal and the second filtered digital signal in order to generate an output digital signal; or (ii) combining selected proportions of each of the first filtered digital signal and the second filtered digital signal in order to generate the output digital signal.

In accordance with these and other embodiments of the present disclosure, a power delivery system may include a power converter and control circuitry configured to control operation of the power converter, and control circuitry comprising: an analog sensing system configured to receive an analog input signal and an analog-to-digital conversion system, comprising an analog-to-digital converter configured to convert an analog input signal into an equivalent digital input signal, a first filtering path configured to filter the equivalent digital input signal to generate a first filtered digital signal, wherein the first filtering path comprises a zero-overshoot monotonic step response filter, a second filtering path configured to filter the equivalent digital input signal to generate a second filtered digital signal, wherein the second filtering path comprises a frequency-selective filter; and a mixer configured to either: (i) select between the first filtered digital signal and the second filtered digital signal in order to generate an output digital signal; or (ii) combine selected proportions of each of the first filtered digital signal and the second filtered digital signal in order to generate the output digital signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
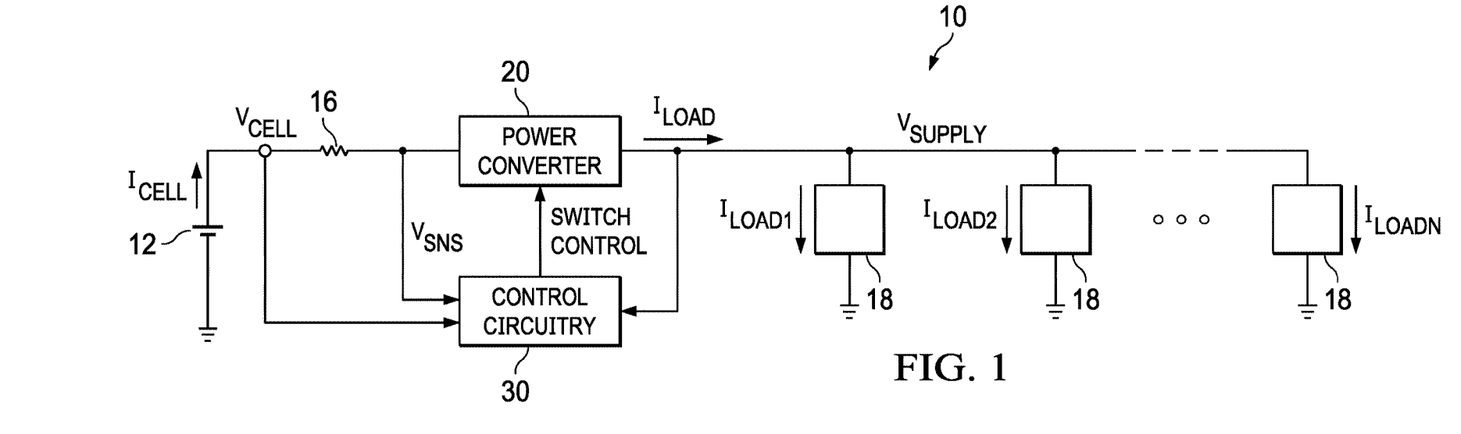
FIG. 1 illustrates a block diagram of selected components of an example power delivery network, in accordance with embodiments of the present disclosure.

FIG. 1 illustrates a block diagram of selected components of a power delivery network 10, in accordance with embodiments of the present disclosure. In some embodiments, power delivery network 10 may be implemented within a portable electronic device, such as a smart phone, tablet, game controller, and/or other suitable device.

As shown in FIG. 1, power delivery network 10 may include a battery 12 and a power converter 20 configured to convert a battery voltage $V_{CELL}$ generated by battery 12 into a supply voltage $V_{SUPPLY}$ used to power a plurality of downstream components 18, wherein each downstream component 18 may draw a respective current $I_{LOAD1}$, $I_{LOAD2}$, $I_{LOAD3}$, etc., from the output of power converter 20, meaning an aggregate load current $I_{LOAD}=I_{LOAD1}+I_{LOAD2}+\ldots+I_{LOADN}$ may be generated by power converter 20. Power converter 20 may be implemented using a boost converter, buck converter, buck-boost converter, transformer, charge pump, and/or any other suitable power converter. Downstream components 18 of power delivery network 10 may include any suitable functional circuits or devices of power delivery network 10, including without limitation other power converters, processors, audio coder/decoders, amplifiers, display devices, etc.

As shown in FIG. 1, power delivery network 10 may also include control circuitry 30 for controlling operation of power converter 20, including switching and commutation of switches internal to power converter 20. In addition, control circuitry 30 may also implement active protection mechanisms for limiting current $I_{CELL}$ drawn from battery 12. For example, control circuitry 30 may include sensor circuitry for measuring battery voltage $V_{CELL}$, supply voltage $V_{SUPPLY}$, and current $I_{CELL}$ based on battery voltage $V_{CELL}$ and a sense voltage $V_{SNS}$, (e.g., $I_{CELL}=(V_{CELL}-V_{SNS})/R$, wherein R is a resistance of a sense resistor 16. Based on such measurements, control circuitry 30 may control power converter 20 to implement active protection mechanisms to limit current $I_{CELL}$ while regulating supply voltage $V_{SUPPLY}$ at or near a desired voltage level. Details of active protection mechanisms are beyond the scope of this disclosure.

Figure 2:
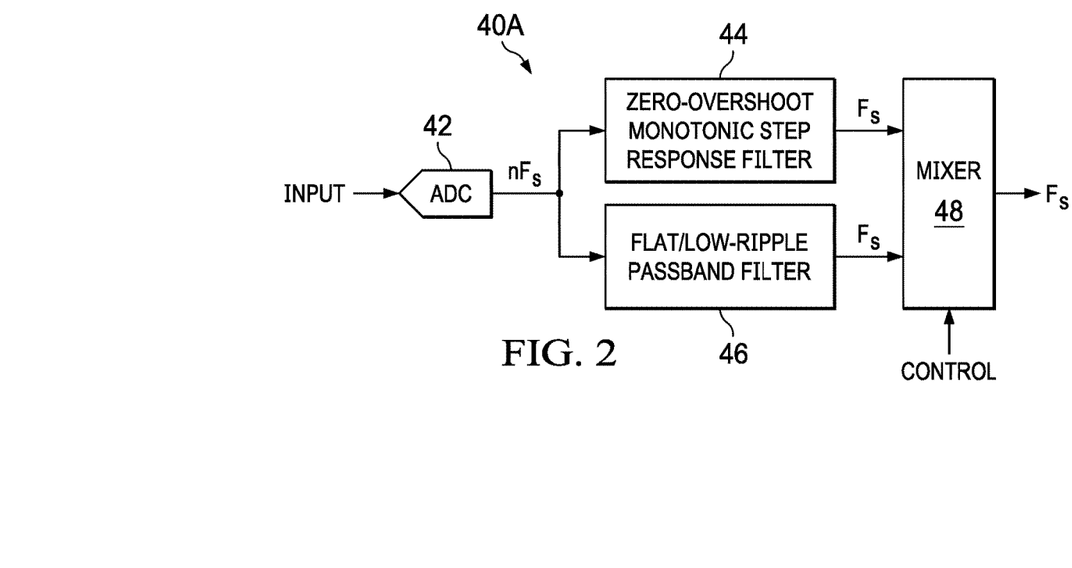
FIG. 2 illustrates a block diagram of selected components of an example analog-to-digital conversion system, in accordance with embodiments of the present disclosure.

FIG. 2 illustrates a block diagram of selected components of an analog-to-digital conversion system 40A, in accordance with embodiments of the present disclosure. In some embodiments, analog-to-digital conversion system 40A may be implemented within control circuitry 30 and used in connection with measurement of a physical quantity (e.g., battery voltage $V_{CELL}$, supply voltage $V_{SUPPLY}$, current $I_{CELL}$, etc.) associated with power delivery network 10.

As shown in FIG. 2, analog-to-digital conversion system 40A may include an analog-to-digital converter (ADC) 42 configured to receive an analog signal (e.g., an analog measurement of battery voltage $V_{CELL}$, supply voltage $V_{SUPPLY}$, current $I_{CELL}$, etc.) and convert such analog signal to an equivalent digital signal having a sample rate of $nF_s$, wherein factor n is a positive integer. In some embodiments, ADC 42 may be implemented as a delta-sigma ADC.

As also shown in FIG. 2, analog-to-digital conversion system 40A may include a zero-overshoot monotonic step response filter 44. Zero-overshoot monotonic step response filter 44 may be configured to receive the digital signal generated by ADC 42 and apply filtering (in accordance with requirements described below) to the digital signal and decimate the signal by factor n to generate a first filtered digital signal having a sample rate of $F_s$. Zero-overshoot monotonic step response filter 44 may satisfy the following requirements:
  no overshoot in response to step input received by zero-overshoot monotonic step response filter 44;
  monotonicity in the step response of zero-overshoot monotonic step response filter 44;
  implementation as a linear phase finite impulse response (FIR) filter;
  minimal passband droop;
  maximal stopband attenuation; and
  having least order and group delay for a given requirement.

As also shown in FIG. 2, analog-to-digital conversion system 40A may include flat/low-ripple passband filter 46. Flat/low-ripple passband filter 46 may be configured to receive the digital signal generated by ADC 42 and apply filtering (in accordance with requirements described below) to the digital signal and decimate the signal by factor n to generate a second filtered digital signal having a sample rate of $F_s$. Flat/low-ripple passband filter 46 may satisfy the following requirements:
  minimal passband ripple;
  maximal stopband attenuation; and
  a sharp transition band or "roll-off."

As further shown in FIG. 2, analog-to-digital conversion system 40A may include a mixer 48. In operation, mixer 48 may be configured to, responsive to a suitable control signal generated by control circuitry 30, select between the first filtered digital signal and the second filtered digital signal, or mix proportions of each of between the first filtered digital signal and the second filtered digital signal, to generate an output digital signal, also having a sample rate of $F_s$. Such resulting output digital signal may be used by other processing components of control circuitry 30 to perform active protection within power deliver network 10.

Figure 3:
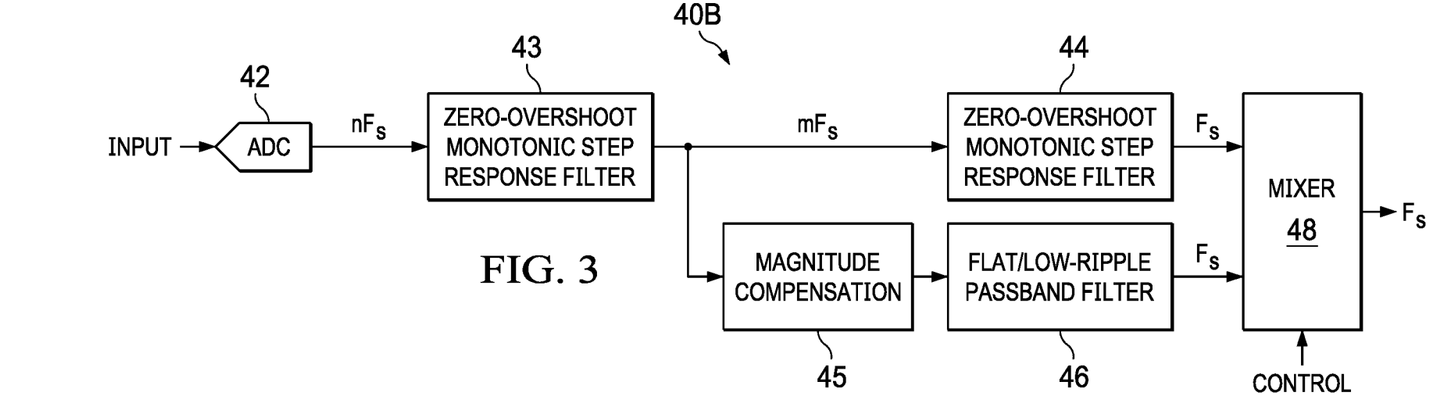
FIG. 3 illustrates a block diagram of selected components of another example analog-to-digital conversion system, in accordance with embodiments of the present disclosure.

FIG. 3 illustrates a block diagram of selected components of an analog-to-digital conversion system 40B, in accordance with embodiments of the present disclosure. In some embodiments, analog-to-digital conversion system 40B may be implemented within control circuitry 30 and used in connection with measurement of a physical quantity (e.g., battery voltage $V_{CELL}$, supply voltage $V_{SUPPLY}$, current $I_{CELL}$, etc.) associated with power delivery network 10. Analog-to-digital conversion system 40B may be similar in many respects to analog-to-digital conversion system 40A, with a difference that in analog-to-digital conversion system 40B, some portion of zero-overshoot monotonic step response filter 44 may be made common between the two filtering paths of analog-to-digital conversion system 40B, implemented using common zero-overshoot monotonic step response filter 43 as shown in FIG. 3. Use of common zero-overshoot monotonic step response filter 43 may render analog-to-digital conversion system 40B more power and area efficient as compared to analog-to-digital conversion system 40A.

In analog-to-digital conversion system 40B, common zero-overshoot monotonic step response filter 43 may apply filtering (in accordance with requirements for zero-overshoot monotonic step response filter 44 described above) to the digital signal (having sample rate $nmF_s$) generated by ADC 42 and decimate the signal by factor n to generate an intermediate filtered digital signal having a sample rate of $mF_s$, where factor m is a positive integer. Further, zero-overshoot monotonic step response filter 44 may be configured to receive the intermediate digital signal and apply filtering (in accordance with requirements for zero-overshoot monotonic step response filter 44 described above) to the intermediate digital signal and decimate the signal by factor m to generate a first filtered digital signal having a sample rate of $F_s$. Similarly, flat/low-ripple passband filter 46 may be configured to receive the intermediate digital signal and apply filtering (in accordance with requirements for flat/low-ripple passband filter 46 described above) to the intermediate digital signal and decimate the signal by factor m to generate a first filtered digital signal having a sample rate of $F_s$.

As shown in FIG. 3, in order to compensate for common zero-overshoot monotonic step response filter 43, the signal path including flat/low-ripple passband filter 46 may include a magnitude compensation block 45. In operation, magnitude compensation block 45 may be configured to compensate for pass-band droop caused by zero-overshoot monotonic step response filter 44.

Figure 4:
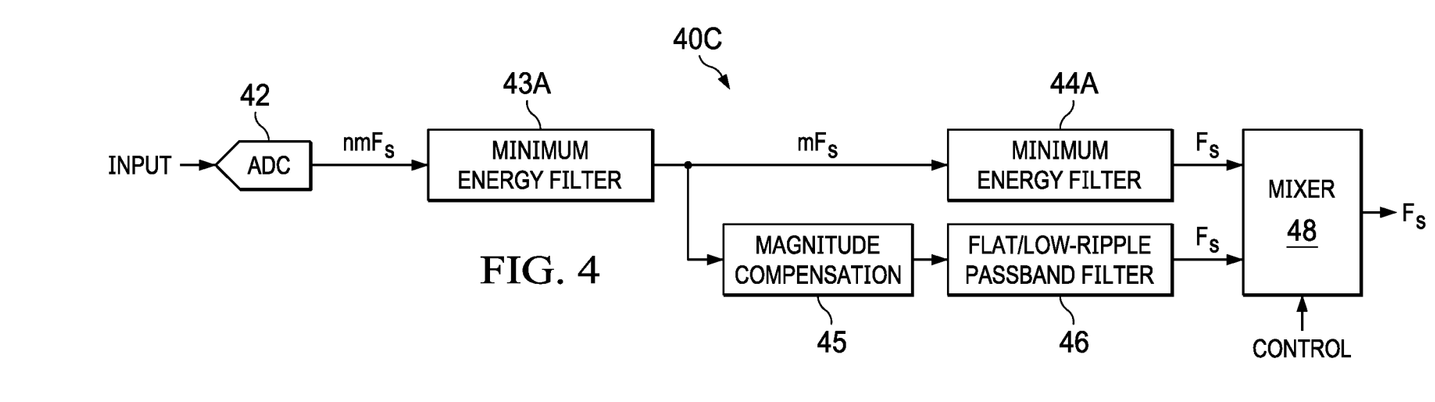
FIG. 4 illustrates a block diagram of selected components of yet another example analog-to-digital conversion system, in accordance with embodiments of the present disclosure.

FIG. 4 illustrates a block diagram of selected components of an analog-to-digital conversion system 40C, in accordance with embodiments of the present disclosure. In some embodiments, analog-to-digital conversion system 40C may be implemented within control circuitry 30 and used in connection with measurement of a physical quantity (e.g., battery voltage $V_{CELL}$, supply voltage $V_{SUPPLY}$, current $I_{CELL}$, etc.) associated with power delivery network 10. Analog-to-digital conversion system 40C may be similar in many respects to analog-to-digital conversion system 40B, in that analog-to-digital conversion system 40C may implement zero-overshoot monotonic step response filter 43 and zero-overshoot monotonic step response filter 44 as a minimum energy filter 43A and minimum energy filter 44A, respectively. Each of minimum energy filters 43A and 44A may be a filter in which coefficients are symmetric with respect to the center of the length of such filter, the magnitude response to direct current is constrained to be unity (or any other suitable value), and the stopband energy is minimized Such a filter may provide a smooth step response.

The frequency response of minimum energy filter 43A may be characterized by:

$$H_{ME}(e^{j\omega}) = M(\omega)e^{-j(\frac{N-1}{2})\omega}$$

where:

$$M(\omega) = \sum_{n=0}^{\frac{N-1}{2}} b(n)\cos(n\omega)$$

N may be odd, so accordingly:

$$b(n) = \begin{cases} h\left(\frac{N-1}{2}\right) & n = 0 \\ 2h\left(\frac{N-1}{2} - n\right) & 1 \leq n \leq \frac{N-1}{2} \end{cases}$$

For minimum energy filter 43A, an objective function may be given by:

$$E_{mse} = \int_{\omega_a}^{K} b^T c(\omega) c^T(\omega) b d\omega$$

where $\omega_a$ is the stopband edge in rad/sec and:

$$c(\omega) = [1 \ \cos(\omega) \ \ldots \ \cos((N-1)/2\omega))]^T$$

The mean-square error $E_{mse}$ may be written in a quadratic form as:

$$E_{mse} = b^T Q b$$

where:

$$Q = \int_{\omega_a}^{K} c(\omega) c^T(\omega) d\omega$$

The above error may be minimized with respect to the coefficients b(n), with the constraint that:

$$b^T \cos(n\omega_z) = 1$$

where $\omega_z = 0$. Such an optimization may be carried out using quadratic programming A similar expression may be developed for minimum energy filter 44A.

Figure 5:
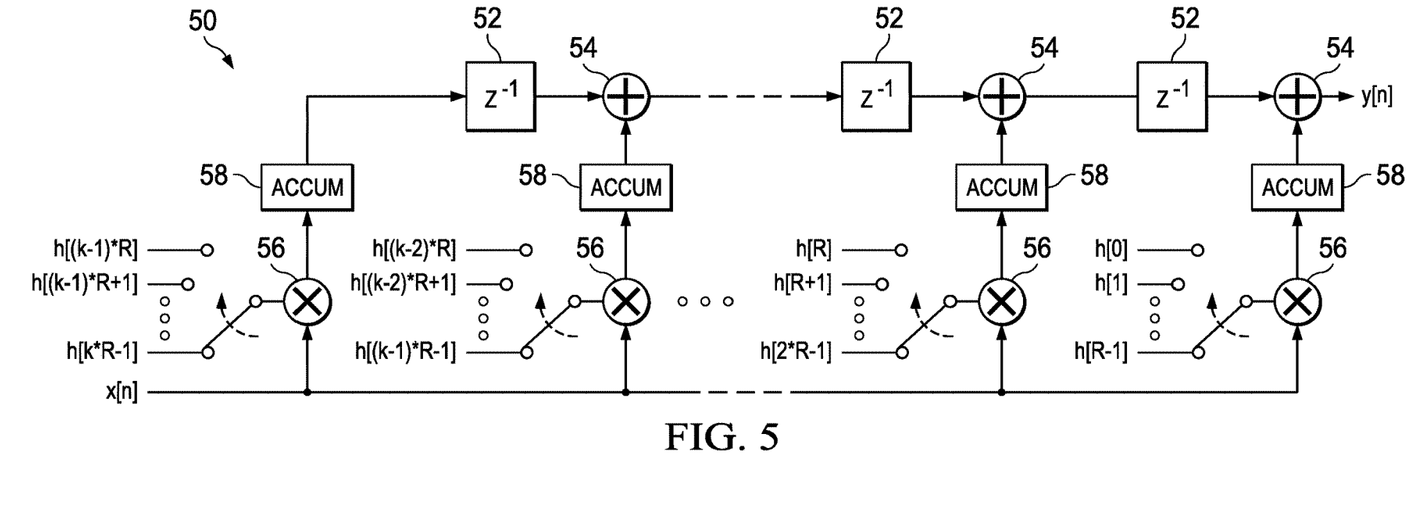
FIG. 5 illustrates a block diagram of an example minimum energy filter implemented as a decimation filter, in accordance with embodiments of the present disclosure.

FIG. 5 illustrates a block diagram of an example minimum energy filter 50 implemented as a decimation filter, in accordance with embodiments of the present disclosure. Minimum energy filter 50 may be used to implement minimum energy filter 43A and/or minimum energy filter 44A. As shown in FIG. 5, minimum energy filter 50 may have a transpose direct form polyphase filter architecture. In FIG. 5, x[n] may represent an input to minimum energy filter 50 and y[n] may represent the decimated output of minimum energy filter 50. Logic implemented by delay blocks 52 and summers 54 may execute at the output sample rate of output y[n]. Thus, if minimum energy filter 50 has N coefficients and an output sample rate of R, then it may require a number k of multipliers 56 and accumulators 58 wherein k=ceil(log$_2$(N/R)) and a number of delay blocks 52 and summers 54 equal to k−1. In minimum energy filter 50, coefficients may be multiplied with input x[n] at every input cycle and accumulated over R cycles, and each stage of minimum energy filter 50 may commutate between R coefficients.

Figure 6:
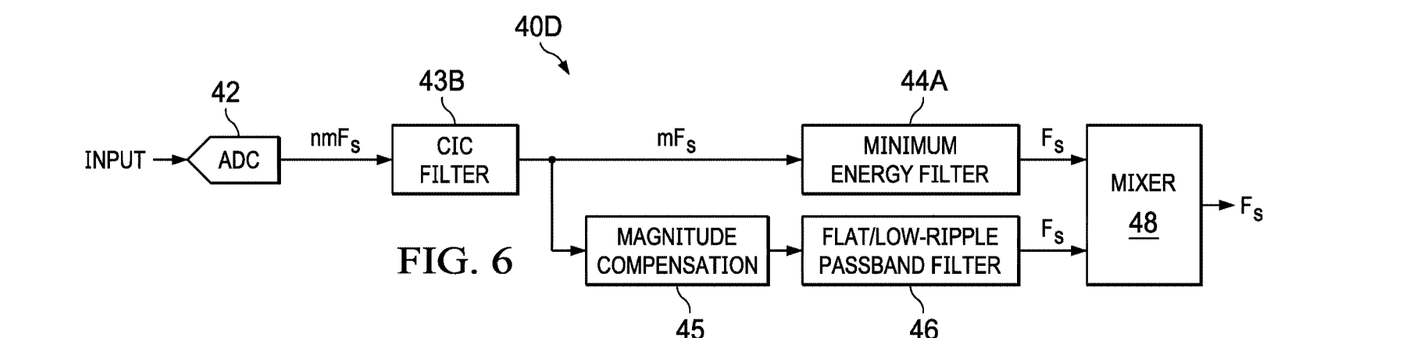
FIG. 6 illustrates a block diagram of selected components of another example analog-to-digital conversion system, in accordance with embodiments of the present disclosure.

FIG. 6 illustrates a block diagram of selected components of an analog-to-digital conversion system 40D, in accordance with embodiments of the present disclosure. In some embodiments, analog-to-digital conversion system 40D may be implemented within control circuitry 30 and used in connection with measurement of a physical quantity (e.g., battery voltage $V_{CELL}$, supply voltage $V_{SUPPLY}$, current $I_{CELL}$, etc.) associated with power delivery network 10. Analog-to-digital conversion system 40D may be similar in many respects to analog-to-digital conversion system 40B, in that analog-to-digital conversion system 40D may implement common zero-overshoot monotonic step response filter 43 as a cascaded integrator-comb (CIC) filter 43B and zero-overshoot monotonic step response filter 44 as a minimum energy filter 44A. For example, in some embodiments, CIC filter 43B may comprise a $4^{th}$-order filter such that decimation factor n=16 and may be cascaded with minimum energy filter 44A having a decimation factor m=6 to provide an overall decimation ratio of 96. CIC filter 43B cascaded with minimum energy filter 44A may have minimal impact on frequency domain characteristics of the data path and may also have no overshoot in response to a step input. CIC filter 43B may increase group delay (as compared to minimum energy filter 43A) but may consume lesser power.

If decimation factor n of the decimator of CIC filter 43B is a power of 2, the transfer function of CIC filter 43B may be represented as:

$$H_{CIC}(z) = \left(\prod_{n=0}^{M-1}\left(1+z^{-2^n}\right)\right)^K \boxed{\downarrow R} =$$

$$(1+z^{-1})^4 \boxed{\downarrow 2}(1+z^{-1})^4 \boxed{\downarrow 2}(1+z^{-1})^4 \boxed{\downarrow 2}(1+z^{-1})^4 \boxed{\downarrow 2}$$

where $R=2^M$. As seen from the above equation, CIC filter 43B may be built as a cascade of four identical five-tap symmetrical finite impulse response filters. The transfer function of CIC filter 43B may be given as:

$$H_{CIC}(z)=(E_0(z^2)+z^{-1}E_1(z^2))\boxed{\downarrow 2}(E_0(z^2)+z^{-1}E_1(z^2))$$
$$\boxed{\downarrow 2}(E_0(z^2)+z^{-1}E_1(z^2))\boxed{\downarrow 2}(E_0(z^2)+z^{-1}E_1(z^2))$$
$$\boxed{\downarrow 2}$$

wherein:

$$E_0(z^2)=1+6z^{-2}+z^{-4}$$

and $$E_1(z^2)=4(1+z^{-2})$$

Use of CIC filter 43B having a decimation factor with a power of 2 may allow for decimation to be performed without any signal integrators, which may minimize power consumption and physical area needed for CIC filter 43B.

Figure 7:
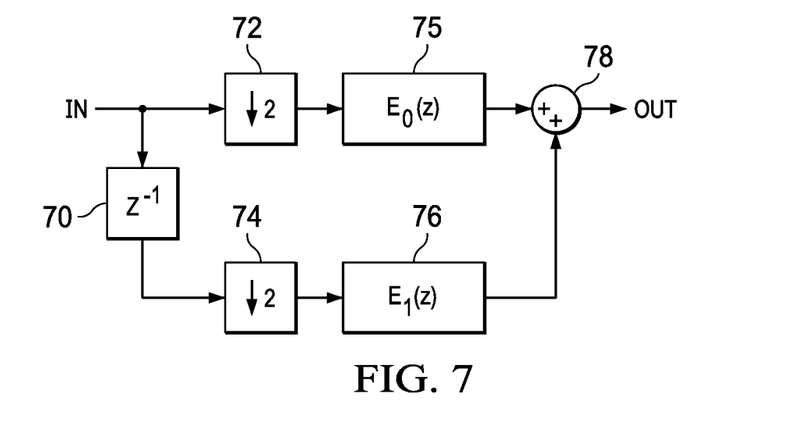
FIG. 7 illustrates a block diagram of selected components of an example cascaded integrator-comb (CIC) filter, in accordance with embodiments of the present disclosure.

FIG. 7 illustrates a block diagram of selected components of CIC filter 43B, in accordance with embodiments of the present disclosure. CIC filter 43B may include delay block 70, decimators 72 and 74, response blocks 75 and 76 (having responses $E_0(z)$ and $E_1(z)$, respectively), and combiner 78, arranged as shown in FIG. 7.

Figure 8:
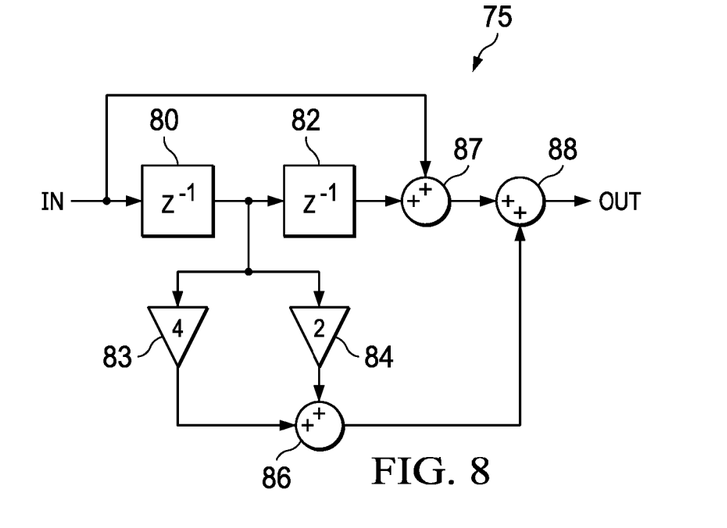
FIG. 8 illustrates a block diagram of selected example components of block $E_0(Z)$ of the CIC filter of FIG. 7, in accordance with embodiments of the present disclosure.

FIG. 8 illustrates a block diagram of selected components of response block 75 (e.g., $E_0(z)$) of CIC filter 43B, in accordance with embodiments of the present disclosure. Response block 75 may include delay elements 80 and 82, gain elements 83 and 84, and combiners 86, 87, and 88, arranged as shown in FIG. 8.

Figure 9:
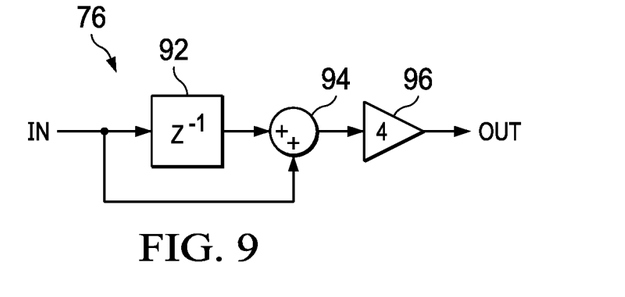
FIG. 9 illustrates a block diagram of selected example components of block $E_1(Z)$ of the CIC filter of FIG. 7, in accordance with embodiments of the present disclosure.

FIG. 9 illustrates a block diagram of selected components of response block 76 (e.g., $E_1(z)$) of CIC filter 43B, in accordance with embodiments of the present disclosure. Response block 76 may include delay element 92, combiner 94, and gain element 96, arranged as shown in FIG. 9.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An analog-to-digital conversion system, comprising:
an analog-to-digital converter configured to convert an analog input signal into an equivalent digital input signal;
a first filtering path configured to filter the equivalent digital input signal to generate a first filtered digital signal, wherein the first filtering path comprises a zero-overshoot monotonic step response filter;
a second filtering path configured to filter the equivalent digital input signal to generate a second filtered digital signal, wherein the second filtering path comprises a frequency-selective filter; and
a mixer configured to either: (i) select between the first filtered digital signal and the second filtered digital signal in order to generate an output digital signal; or (ii) combine selected proportions of each of the first filtered digital signal and the second filtered digital signal in order to generate the output digital signal.

2. The analog-to-digital conversion system of claim 1, wherein the frequency-selective filter comprises a flat/low-ripple passband filter.

3. The analog-to-digital conversion system of claim 1, further comprising a common zero-overshoot monotonic step response filter common to the first filtering path and the second filtering path.

4. The analog-to-digital conversion system of claim 3, wherein:
the common zero-overshoot monotonic step response filter is implemented as a first minimum energy filter; and
the zero-overshoot monotonic step response filter is implemented as a second minimum energy filter.

5. The analog-to-digital conversion system of claim 3, wherein:
the common zero-overshoot monotonic step response filter is a cascaded integrator-comb filter; and
the zero-overshoot monotonic step response filter is implemented as a minimum energy filter.

6. The analog-to-digital conversion system of claim 5, wherein the cascaded integrator-comb filter has a decimation factor which is an exponential power of 2.

7. A method, comprising:
converting an analog input signal into an equivalent digital input signal;
filtering, with a first filtering path, the equivalent digital input signal to generate a first filtered digital signal, wherein the first filtering path comprises a zero-overshoot monotonic step response filter;
filtering, with a second filtering path, the equivalent digital input signal to generate a second filtered digital signal, wherein the second filtering path comprises a frequency-selective filter; and
either: (i) selecting between the first filtered digital signal and the second filtered digital signal in order to generate an output digital signal; or (ii) combining selected proportions of each of the first filtered digital signal and the second filtered digital signal in order to generate the output digital signal.

8. The method of claim 7, wherein the frequency-selective filter comprises a flat/low-ripple passband filter.

9. The method of claim 7, further comprising applying a common zero-overshoot monotonic step response filter common to the first filtering path and the second filtering path.

10. The method of claim 9, wherein:
the common zero-overshoot monotonic step response filter is implemented as a first minimum energy filter; and
the zero-overshoot monotonic step response filter is implemented as a second minimum energy filter.

11. The method of claim 9, wherein:
the common zero-overshoot monotonic step response filter is a cascaded integrator-comb filter; and
the zero-overshoot monotonic step response filter is implemented as a minimum energy filter.

12. The method of claim 11, wherein the cascaded integrator-comb filter has a decimation factor which is an exponential power of 2.

13. A power delivery system comprising:
a power converter; and
control circuitry configured to control operation of the power converter, and control circuitry comprising:
an analog sensing system configured to receive an analog input signal; and
an analog-to-digital conversion system, comprising:
an analog-to-digital converter configured to convert an analog input signal into an equivalent digital input signal;
a first filtering path configured to filter the equivalent digital input signal to generate a first filtered digital signal, wherein the first filtering path comprises a zero-overshoot monotonic step response filter;
a second filtering path configured to filter the equivalent digital input signal to generate a second filtered digital signal, wherein the second filtering path comprises a frequency-selective filter; and
a mixer configured to either: (i) select between the first filtered digital signal and the second filtered digital signal in order to generate an output digital signal; or (ii) combine selected proportions of each of the first filtered digital signal and the second filtered digital signal in order to generate the output digital signal.

14. The power delivery system of claim 13, wherein the frequency-selective filter comprises a flat/low-ripple passband filter.

15. The power delivery system of claim 13, further comprising a common zero-overshoot monotonic step response filter common to the first filtering path and the second filtering path.

16. The power delivery system of claim 15, wherein:
the common zero-overshoot monotonic step response filter is implemented as a first minimum energy filter; and
the zero-overshoot monotonic step response filter is implemented as a second minimum energy filter.

17. The power delivery system of claim 15, wherein:
the common zero-overshoot monotonic step response filter is a cascaded integrator-comb filter; and
the zero-overshoot monotonic step response filter is implemented as a minimum energy filter.

18. The power delivery system of claim 17, wherein the cascaded integrator-comb filter has a decimation factor which is an exponential power of 2.

* * * * *

UNITED STATES PATENT AND TRADEMARK OFFICE
CERTIFICATE OF CORRECTION

PATENT NO. : 11,349,490 B2
APPLICATION NO. : 17/167957
DATED : May 31, 2022
INVENTOR(S) : Kidambi et al.

It is certified that error appears in the above-identified patent and that said Letters Patent is hereby corrected as shown below:

In the Specification

1. In Column 3, Line 52, delete "current" and insert -- load current --, therefor.

2. In Column 4, Line 67, delete "each of" and insert -- each --, therefor.

3. In Column 5, Line 5, delete "power deliver network 10." and insert -- power delivery network 10. --, therefor.

4. In Column 6, Lines 5-6, delete "minimized" and insert -- minimized. --, therefor.

5. In Column 6, Line 11, delete "$H_{ME}(e^{j\omega}) = M(\omega)e^{-j\left(\frac{N-1}{2}\right)\omega}$" and insert -- $H_{ME}(e^{j\omega}) = M(\omega)e^{-j\left(\frac{N-1}{2}\right)\omega}$ --, therefor.

6. In Column 6, Line 30, delete "$E_{mse} = \int_{\omega_a}^{K} b^T c(\omega) c^T(\omega) b d\omega$" and insert -- $E_{mse} = \int_{\omega_a}^{\pi} b^T c(\omega) c^T(\omega) b \, d\omega$ --, therefor.

7. In Column 6, Line 33, delete "$c(\omega) = [1 \; \cos(\omega) \; \ldots \; \cos((N-1)/2\omega))]^T$" and insert -- $c(\omega) = [1 \; \cos(\omega) \; \cdots \; \cos((N-1)/2\omega)]^T$ --, therefor.

Signed and Sealed this
Fifteenth Day of August, 2023

Katherine Kelly Vidal
*Director of the United States Patent and Trademark Office*

CERTIFICATE OF CORRECTION (continued)
U.S. Pat. No. 11,349,490 B2

8. In Column 6, Line 41, delete "$Q=\int_{\omega_a}^{K} c(\omega)c^T(\omega)d\omega$" and insert -- $Q=\int_{\omega_a}^{\pi} c(\omega)c^T(\omega)\,d\omega$ --, therefor.

9. In Column 6, Line 46, delete "$\omega_2=0$." and insert -- $\omega_z=0$. --, therefor.

10. In Column 6, Line 47, delete "programming" and insert -- programming. --, therefor.

11. In Column 7, Lines 30-33, delete "
$$H_{CIC}(z) = \left(\prod_{n=0}^{M-1}(1+z^{-2^n})\right)^K \boxed{\downarrow R} =$$
$$(1+z^{-1})^4 \boxed{\downarrow 2}(1+z^{-1})^4\boxed{\downarrow 2}(1+z^{-1})^4\boxed{\downarrow 2}(1+z^{-1})^4\boxed{\downarrow 2}$$
" and insert --
$$H_{CIC}(z) = \left(\prod_{n=0}^{M-1}(1+z^{-2^n})\right)^K \boxed{\downarrow R} =$$
$$(1+z^{-1})^4\boxed{\downarrow 2}(1+z^{-1})^4\boxed{\downarrow 2}(1+z^{-1})^4\boxed{\downarrow 2}(1+z^{-1})^4\boxed{\downarrow 2}$$
--, therefor.